(12) United States Patent
Chiu et al.

(10) Patent No.: US 9,397,557 B2
(45) Date of Patent: Jul. 19, 2016

(54) CHARGE PUMP WITH WIDE OPERATING RANGE

(71) Applicant: MediaTek Inc., Hsin-Chu (TW)

(72) Inventors: Wei-Hao Chiu, Taichung (TW); Ang-Sheng Lin, Kaohsiung (TW)

(73) Assignee: MEDIATEK INC., Hsin-Chu (TW)

( * ) Notice: Subject to any disclaimer, the term of this patent is extended or adjusted under 35 U.S.C. 154(b) by 118 days.

(21) Appl. No.: 14/278,207

(22) Filed: May 15, 2014

(65) Prior Publication Data

US 2015/0333623 A1 Nov. 19, 2015

(51) Int. Cl.
H03L 7/06 (2006.01)
H02M 3/07 (2006.01)
H02M 1/00 (2006.01)
H03L 7/089 (2006.01)

(52) U.S. Cl.
CPC *H02M 3/07* (2013.01); *H02M 1/00* (2013.01); *H03L 7/0895* (2013.01); *H03L 7/0896* (2013.01); *H02M 2001/0025* (2013.01); *H02M 2001/0083* (2013.01)

(58) Field of Classification Search
CPC ....... H03L 7/0895; H03L 7/0896; H03L 7/18; H03L 7/0891; H03L 7/0893
USPC .................. 327/156, 157, 148, 536
See application file for complete search history.

(56) References Cited

U.S. PATENT DOCUMENTS

| | | | |
|---|---|---|---|
| 4,524,333 A | | 6/1985 | Iwata et al. |
| 5,898,336 A | | 4/1999 | Yamaguchi |
| 6,052,015 A | * | 4/2000 | Desbonnets .................. 327/382 |
| 6,597,217 B2 | * | 7/2003 | Ingino, Jr. ..................... 327/157 |
| 2003/0038669 A1 | * | 2/2003 | Zhang ........................... 327/536 |
| 2004/0085106 A1 | | 5/2004 | Jeong |
| 2006/0181333 A1 | * | 8/2006 | Holland ......................... 327/536 |
| 2007/0013434 A1 | * | 1/2007 | Peschke ........................ 327/536 |
| 2012/0098579 A1 | | 4/2012 | Schober et al. |

OTHER PUBLICATIONS

Chen, W.H., et al.; "A 0.5-V, 440-µW Frequency Synthesizer for Implantable Medical Devices;" IEEE; 2011; pp. 1-4.
Yu, S.A., et al.; "A 0.65V 2.5GHz Fractional-N Frequency Synthesizer in 90nm CMOS;" ISSSCC 2007; Session 17; Analog Techniques and PLLs; 2007; pp. 305, 306, & 604.
Hedayati, H., et al.; "A 3 GHz Wideband Fractional-N Synthesizer With Switched-RC Sample-and-Hold PFD;" IEEE Transactions on Very Large Scale Integration (VLSI) Systems; vol. 20; No. 9; Sep. 2012; pp. 1681-1690.
Hsieh, H.H., et al.; "A 0.5-V 1.9-GHz Low-Power Phase-Locked Loop in 0.18-jtm CMOS;" 2007 Symposium on VLSI Circuits Digest of Technical Papers; 2007; pp. 164-165.

* cited by examiner

*Primary Examiner* — Quan Tra
(74) *Attorney, Agent, or Firm* — McClure, Qualey & Rodack, LLP (57) ABSTRACT

A charge pump at least includes a current source, a first switch, a second switch, a level-shift circuit, and a capacitor. The first switch is coupled between the current source and an internal node. The capacitor is coupled between the internal node and the level-shift circuit. The second switch is coupled between the internal node and an output node. The first switch performs a closing-and-opening operation and the level-shift circuit performs a level-shift operation while the second switch is kept open and the internal node is isolated from the output node. The operating range of the charge pump is effectively widened by using the proposed design.

17 Claims, 8 Drawing Sheets

CHARGE PUMP WITH WIDE OPERATING RANGE

BACKGROUND OF THE INVENTION

1. Field of the Invention

The disclosure generally relates to a charge pump, and more particularly, to a charge pump with a wide operating range.

2. Description of the Related Art

Figure 1A:
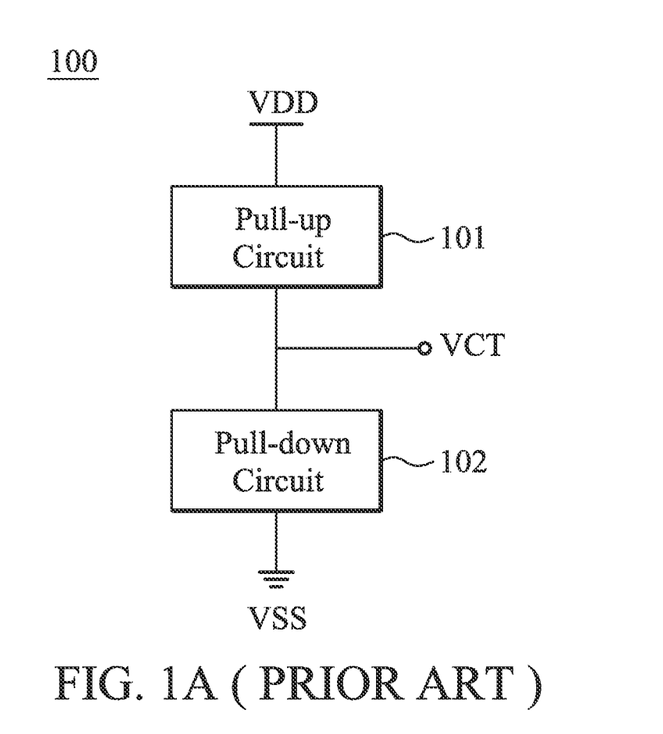
FIG. 1A is a diagram of a conventional charge pump.
Figure 1B:
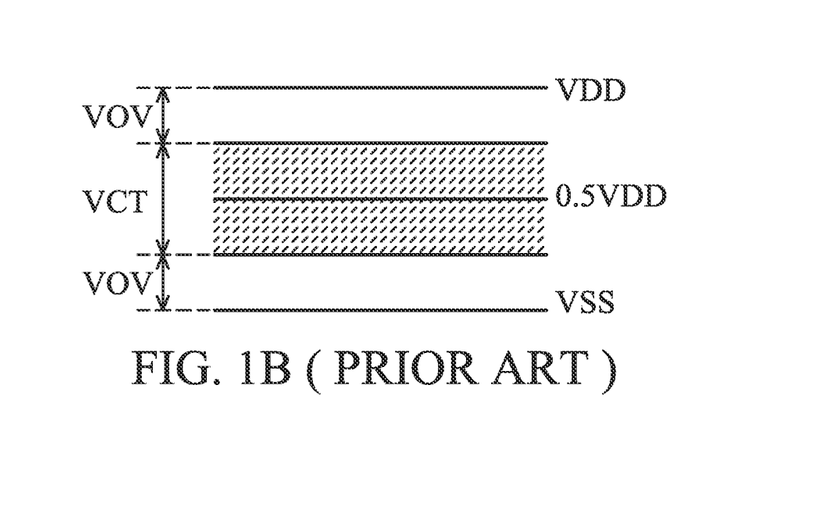
FIG. 1B is a diagram of an operating range of a conventional charge pump.

FIG. 1A is a diagram of a conventional charge pump 100. The conventional charge pump 100 includes a pull-up circuit 101 and a pull-down circuit 102, and both of the circuits are used to adjust a control voltage VCT therebetween. The control voltage VCT is further used as an output voltage of the conventional charge pump 100, and it may be applied to other external circuits. FIG. 1B is a diagram of the operating range of the conventional charge pump 100. Since the control voltage VCT directly affects the operation states of transistors in the pull-up circuit 101 and the pull-down circuit 102, the control voltage VCT should be limited within a specific operating range so as to make the transistors operate in an appropriate work mode, such as a saturation mode. Generally, if the conventional charge pump 100 has a supply voltage VDD and a ground voltage VSS and each transistor therein has an overdrive voltage VOV, the control voltage VCT should be limited by an upper boundary, the supply voltage VDD minus the overdrive voltage VOV, and a lower boundary, the ground voltage VSS plus the overdrive voltage VOV. In other words, the operating range of the control voltage VCT is substantially equal to the supply voltage VDD minus two times the overdrive voltage VOV (i.e., VDD−2×VOV), and it is extremely narrow and not suitable for some circuit applications. Accordingly, there is a need to design a novel charge pump to solve the aforementioned problem of the prior art.

BRIEF SUMMARY OF THE INVENTION

In one exemplary embodiment, the disclosure is directed to a charge pump, including: a first current source; a first switch, coupled between the first current source and a first node; a first level-shift circuit; a first capacitor, coupled between the first node and the first level-shift circuit; and a second switch, coupled between the first node and an output node; wherein the first switch performs a closing-and-opening operation and the first level-shift circuit performs a level-shift operation while the second switch is kept open.

In some embodiments, the first level-shift circuit generates a level-shift signal which switches between a high logic level and a low logic level so as to change a first voltage at the first node. In some embodiments, the first current source supplies a current to the first node. In some embodiments, the first switch is implemented with an MOS transistor (Metal Oxide Semiconductor Field Effect Transistor) which has a control terminal for receiving a first control signal, a first terminal coupled to the first current source, and a second terminal coupled to the first node. In some embodiments, the first level-shift circuit comprises a first inverter which has an input terminal for receiving a second control signal, and output terminal coupled to the first capacitor. In some embodiments, the second control signal is substantially complementary to the first control signal. In some embodiments, the second switch is implemented with a transmission gate which is closed or opened according to a third control signal. In some embodiments, during each operation of the charge pump, the third control signal switches logic level before the first control signal switches logic level, and then the third control signal switches back after the first control signal switches back. In some embodiments, the charge pump further comprises: a second current source; a third switch, coupled between the second current source and a second node; a second level-shift circuit; a second capacitor, coupled between the second node and the second level-shift circuit; and a fourth switch, coupled between the second node and the output node; wherein the third switch performs a closing-and-opening operation and the second level-shift circuit performs a level-shift operation while the fourth switch is kept open. In some embodiments, the second level-shift circuit generates a level-shift signal which switches between a high logic level and a low logic level so as to change a second voltage at the second node. In some embodiments, the first current source supplies a current to the first node, and the second current source draws a current from the second node. In some embodiments, the third switch is implemented with an MOS transistor (Metal Oxide Semiconductor Field Effect Transistor), which has a control terminal for receiving a fourth control signal, a first terminal coupled to the second current source, and a second terminal coupled to the second node. In some embodiments, the second level-shift circuit comprises a second inverter which has an input terminal for receiving a fifth control signal, and output terminal coupled to the second capacitor. In some embodiments, the fifth control signal is substantially complementary to the fourth control signal. In some embodiments, the fourth switch is implemented with a transmission gate which is closed or opened according to a sixth control signal. In some embodiments, during each operation of the charge pump, the sixth control signal switches logic level before the fourth control signal switches logic level, and then the sixth control signal switches back after the fourth control signal switches back.

In another exemplary embodiment, the disclosure is directed to a method for operation of a charge pump, including the steps of: providing the charge pump which includes a first current source, a first level-shift circuit, a first switch, a second switch, and a first capacitor coupled to a first node; changing a logic level of the first capacitor by the first level-shift circuit; coupling the first current source to the first node by the first switch; isolating the first current source from the first node by the first switch; recovering the logic level of the first capacitor by the first level-shift circuit; coupling the first node to an output node of the charge pump by the second switch; and isolating the first node from the output node of the charge pump by the second switch.

In some embodiments, the steps of changing the logic level of the first capacitor, coupling the first current source to the first node, isolating the first current source from the first node, and recovering the logic level of the first capacitor are performed while the first node is kept isolated from the output node of the charge pump. In some embodiments, the charge pump further comprises a second current source, a second level-shift circuit, a third switch, a fourth switch, and a second capacitor coupled to a second node, and wherein the method further comprises: changing a logic level of the second capacitor by the second level-shift circuit; coupling the second current source to the second node by the third switch; isolating the second current source from the second node by the third switch; recovering the logic level of the second capacitor by the second level-shift circuit; coupling the second node to the output node of the charge pump by the fourth switch; and isolating the second node from the output node of the charge pump by the fourth switch. In some embodiments, the steps of changing the logic level of the second capacitor, coupling the second current source to the second node, isolating the second current source from the second node, and recovering the logic level of the second capacitor are performed while the second node is kept isolated from the output node of the charge pump.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention will be described in detail as follows.

Figure 2:
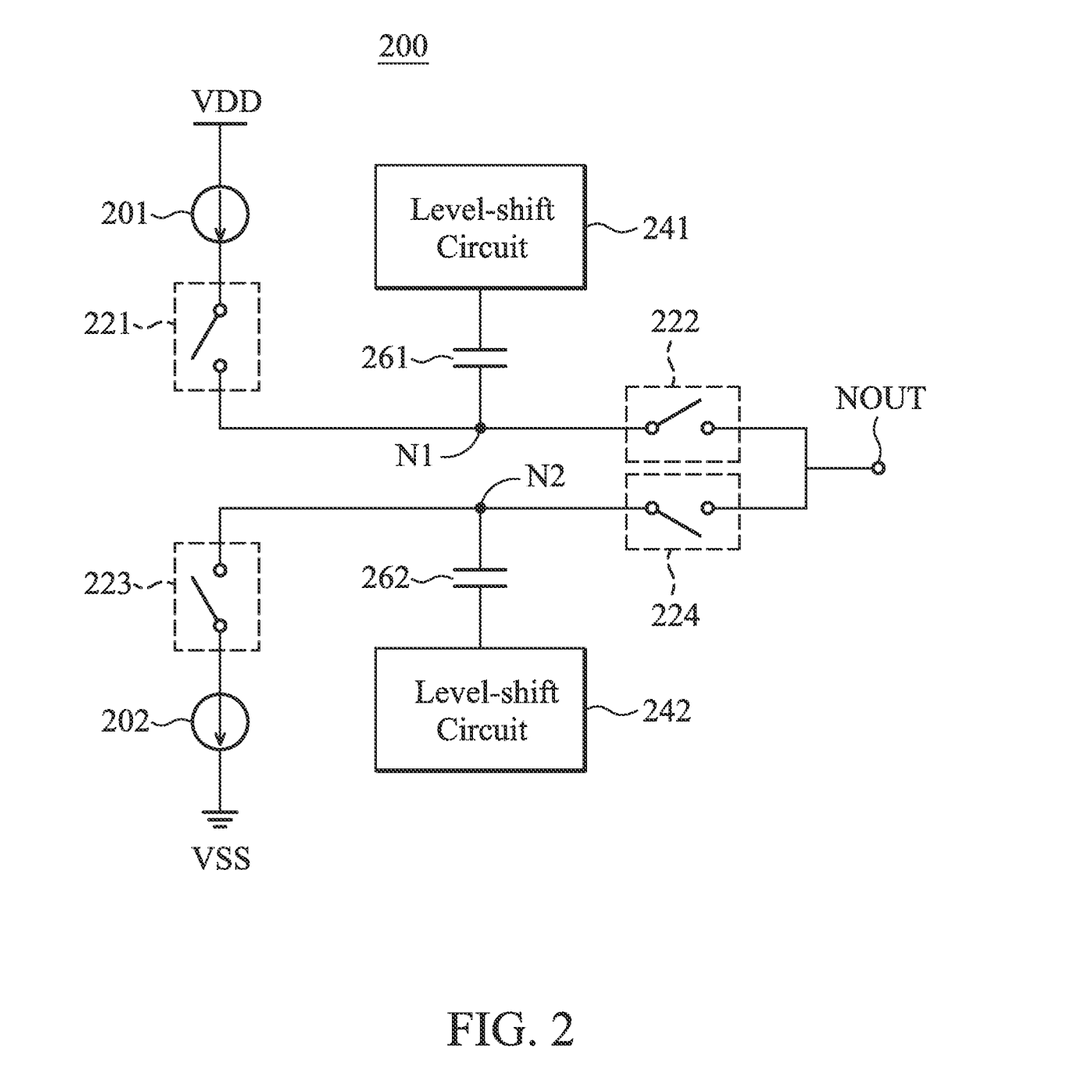
FIG. 2 is a diagram of a charge pump according to an embodiment of the invention.

FIG. 2 is a diagram of a charge pump 200 according to an embodiment of the invention. As shown in FIG. 2, the charge pump 200 includes a first current source 201, a second current source 202, a first switch 221, a second switch 222, a third switch 223, a fourth switch 224, a first level-shift circuit 241, a second level-shift circuit 242, a first capacitor 261, and a second capacitor 262. More particularly, the above components are classified into a pull-up circuit and a pull-down circuit. The pull-up circuit is arranged for pulling up an output voltage at an output node NOUT, and is formed by the first current source 201, the first switch 221, the second switch 222, the first level-shift circuit 241, and the first capacitor 261. The pull-down circuit is arranged for pulling down the output voltage at the output node NOUT, and is formed by the second current source 202, the third switch 223, the fourth switch 224, the second level-shift circuit 242, and the second capacitor 262. The detailed structures and operations of the pull-up circuit and the pull-down circuit will be described in the following embodiments.

The first switch 221 has a first terminal coupled to a current output terminal of the first current source 201, and a second terminal coupled to a first node N1. The first capacitor 261 has a first terminal coupled to the first node N1, and a second terminal coupled to the first level-shift circuit 241. The second switch 222 has a first terminal coupled to the first node N1, and a second terminal coupled to the output node NOUT. The first level-shift circuit 241 can generate a level-shift signal which switches between a high logic level and a low logic level so as to change a first voltage at the first node N1.

Generally, the first switch 221 performs a closing-and-opening operation and the first level-shift circuit 241 performs a level-shift operation only while the second switch 222 is kept open. With such a design, the output node NOUT is temporarily isolated from the first node N1 during the pull-up operation of the charge pump 200. Therefore, the output voltage at the output node NOUT is independent of the variation of the first voltage at the first node N1 during the pull-up operation, and the operating range of the first voltage is effectively widened.

The third switch 223 has a first terminal coupled to a current input terminal of the second current source 202, and a second terminal coupled to a second node N2. The second capacitor 262 has a first terminal coupled to the second node N2, and a second terminal coupled to the second level-shift circuit 242. The fourth switch 224 has a first terminal coupled to the second node N2, and a second terminal coupled to the output node NOUT. The second level-shift circuit 242 can generate a level-shift signal which switches between a high logic level and a low logic level so as to change a second voltage at the second node N2. Generally, the third switch 223 performs a closing-and-opening operation and the second level-shift circuit 242 performs a level-shift operation only while the fourth switch 224 is kept open. With such a design, the output node NOUT is temporarily isolated from the second node N2 during the pull-down operation of the charge pump 200. Therefore, the output voltage at the output node NOUT is independent of the variation of the second voltage at the second node N2 during the pull-down operation, and the operating range of the second voltage is effectively widened.

Figure 3A:
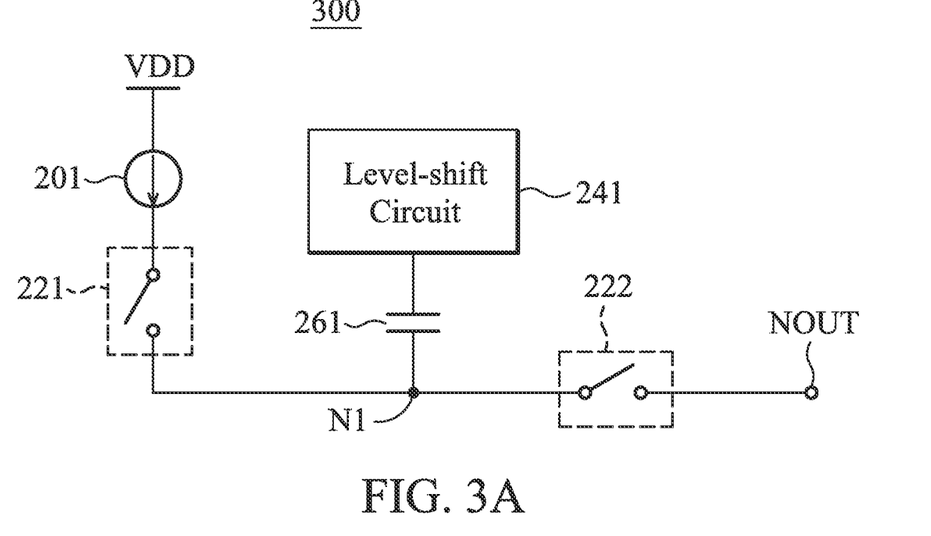
FIG. 3A is a diagram of a charge pump according to an embodiment of the invention.

FIG. 3A is a diagram of a charge pump 300 according to an embodiment of the invention. As shown in FIG. 3A, the charge pump 300 may only include the aforementioned pull-up circuit. That is, in alternative embodiments, the pull-up circuit can be used independently, and the operating range of the charge pump 300 is partially widened during the pull-up operation.

Figure 3B:
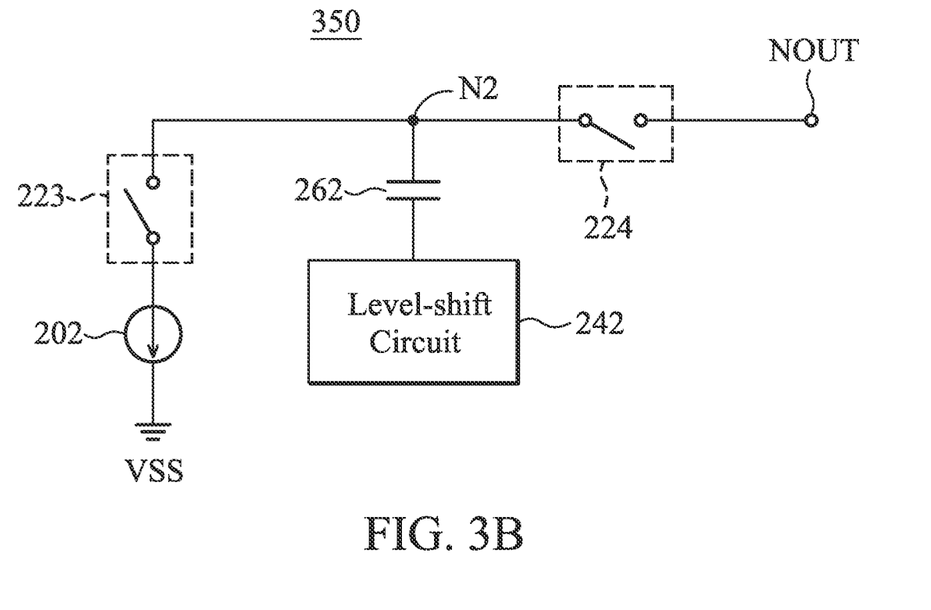
FIG. 3B is a diagram of a charge pump according to an embodiment of the invention.

FIG. 3B is a diagram of a charge pump 350 according to an embodiment of the invention. As shown in FIG. 3B, the charge pump 350 may only include the aforementioned pull-down circuit. That is, in alternative embodiments, the pull-down circuit can be used independently, and the operating range of the charge pump 350 is partially widened during the pull-down operation.

Figure 4:
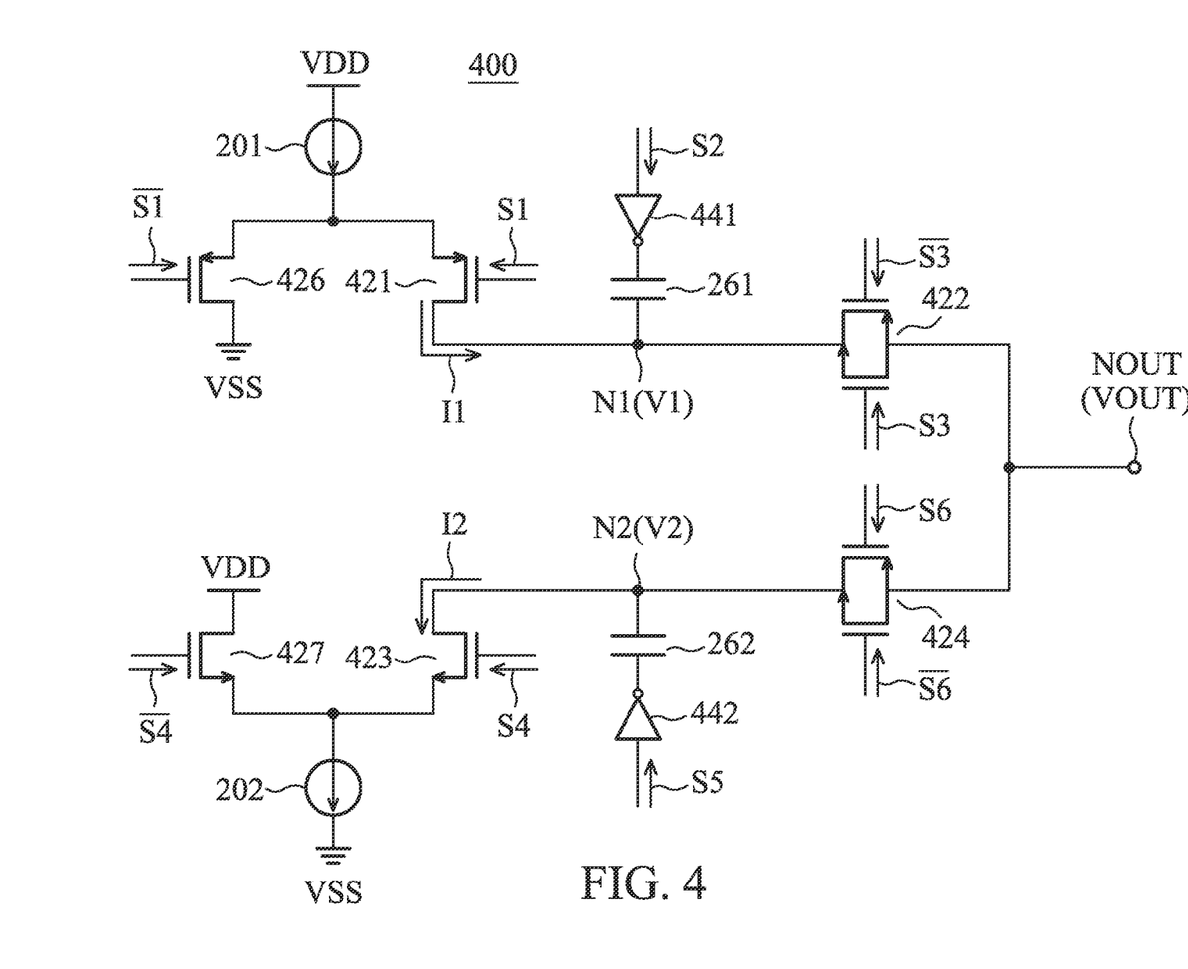
FIG. 4 is a diagram of a charge pump according to a preferred embodiment of the invention.

FIG. 4 is a diagram of a charge pump 400 according to a preferred embodiment of the invention. FIG. 4 is similar to FIG. 2. The charge pump 400 also includes a pull-up circuit and a pull-down circuit. Similarly, in some embodiments, either the pull-up circuit or the pull-down circuit of the charge pump 400 may be used independently. The pull-up circuit includes a first current source 201, a first PMOS transistor (P-type Metal Oxide Semiconductor Field Effect Transistor) 421, a second PMOS transistor 426, a first transmission gate 422, a first capacitor 261, and a first inverter 441. A first switch of the pull-up circuit is implemented with the first PMOS transistor 421 which has a control terminal for receiving a first control signal S1, a first terminal coupled to a current output terminal of the first current source 201, and a second terminal coupled to a first node N1. The first switch selectively couples the current output terminal of the first current source 201 to the first node N1 according to the first control signal S1. A first bypass path is implemented with the second PMOS transistor 426 which has a control terminal for receiving an inverted first control signal $\overline{S1}$ (the first control signal S1 and the inverted first control signal $\overline{S1}$ are complementary), a first terminal coupled to the current output terminal of the first current source 201, and a second terminal coupled to a ground voltage VSS. The first bypass path is selectively closed or opened according to the inverted first control signal $\overline{S1}$. If the first PMOS transistor 421 is enabled, the first current source 201 may supply a first current I1 to the first node N1, and conversely, if the first PNOS transistor 421 is disabled, the first current I1 from the first current source 201 may flow through the first bypass path to the ground voltage VSS. A first level-shift circuit of the pull-up circuit is implemented with the first inverter 441 which has an input terminal for receiving a second control signal S2, and output terminal. The first capacitor 261 has a first terminal coupled to the first node N1, and a second terminal coupled to the output terminal of the first inverter 441. A first voltage V1 at the first node N1 is indirectly controlled by the second control signal S2 through the first inverter 441 and the first capacitor 261. A second switch of the pull-up circuit is implemented with the first transmission gate 422 which is closed or opened according to a third control signal S3 and an inverted third control signal $\overline{S3}$ (the second control signal S3 and the inverted third control signal $\overline{S3}$ are complementary).

Figure 5:
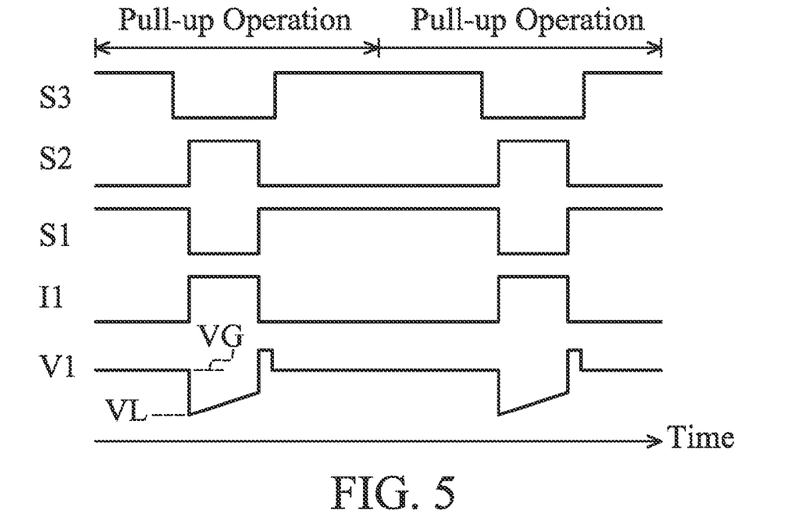
FIG. 5 is a diagram of signal waveforms of a pull-up circuit of a charge pump according to an embodiment of the invention.

FIG. 5 is a diagram of signal waveforms of the pull-up circuit of the charge pump 400 according to an embodiment of the invention. Please refer to FIG. 4 and FIG. 5 together. During each pull-up operation of the charge pump 400, in the beginning, the third control signal S3 switches from a high logic level to a low logic level. As a result, the first transmission gate 422 is opened, and first node N1 is isolated from an output node NOUT of the charge pump 400. Next, the second control signal S2 switches from a low logic level to a high logic level, such that a high-to-low level-shifting transition is applied to the first voltage V1 at the first node N1. As a result, the first voltage V1 at the first node N1 changes from an original voltage VG to a low level-shifting voltage VL, and the low level-shifting voltage VL is substantially equal to the original voltage VG minus a supply voltage VDD of the charge pump 400 (i.e., VL=VG−VDD). Then, the first control signal S1 switches from a high logic level to a low logic level, such that the first PMOS transistor 421 is enabled and the first voltage V1 at the first node N1 is gradually charged up by the first current I1 from the first current source 201. In some embodiments, the waveform of the second control signal S2 is substantially complementary to that of the first control signal S1. In some embodiments, the phase of the second control signal S2 is slightly leading or equal to that of the first control signal S1. After a period of charging time, the first control signal S1 switches from the low logic level back to the high logic level so as to stop the charging-up operation, and the second control signal S2 switches from the high logic level back to the low logic level, such that a low-to-high level-shifting transition is applied to the first voltage V1 at the first node N1. Finally, the third control signal S3 switches from the low logic level back to the high logic level, such that the first transmission gate 422 is closed and the first node N1 is coupled to the output node NOUT. The first voltage V1 at the first node N1 further slightly drops down due to the charge-sharing effect between the first node N1 and the output node NOUT. It is noted that during each pull-up operation of the charge pump 400, the third control signal S3 switches its logic level before the first control signal S1 and the second control signal S2 switch their logic levels, and then the third control signal S3 switches its logic level back after the first control signal S1 and the second control signal S2 switch their logic level back. With such a design, the output voltage VOUT at the output node NOUT is not affected by the variation of the first voltage V1 at the first node N1 during the pull-up operation, and therefore the first voltage V1 has a relatively wide operating range. Theoretically, if each transistor of the charge pump 400 has an overdrive voltage VOV, the first voltage V1 of the charge pump 400 can have a wide operating range which is substantially equal to two times the supply voltage VDD minus two times the overdrive voltage VOV (i.e., 2×VDD−2×VOV), and it can be much wider than that of the conventional design.

Please refer to FIG. 4 again. The pull-down circuit includes a second current source 202, a first NMOS transistor (N-type Metal Oxide Semiconductor Field Effect Transistor) 423, a second NMOS transistor 427, a second transmission gate 424, a second capacitor 262, and a second inverter 442. A third switch of the pull-down circuit is implemented with the first NMOS transistor 423 which has a control terminal for receiving a fourth control signal S4, a first terminal coupled to a current input terminal of the second current source 202, and a second terminal coupled to a second node N2. The third switch selectively couples the current input terminal of the second current source 202 to a second node N2 according to the fourth control signal S4. A second bypass path is implemented with the second NMOS transistor 427 which has a control terminal for receiving an inverted fourth control signal $\overline{S4}$ (the fourth control signal S4 and the inverted fourth control signal $\overline{S4}$ are complementary), a first terminal coupled to the current input terminal of the second current source 202, and a second terminal coupled to the supply voltage VDD. The second bypass path is selectively closed or opened according to the inverted fourth control signal $\overline{S4}$. If the first NMOS transistor 423 is enabled, the second current source 202 may draw a second current I2 from the second node N2, and conversely, if the first NMOS transistor 423 is disabled, the second current I2 to the second current source 202 may flow through the second bypass path from the supply voltage VDD. A second level-shift circuit of the pull-down circuit is implemented with the second inverter 442 which has an input terminal for receiving a fifth control signal S5, and output terminal. The second capacitor 262 has a first terminal coupled to the second node N2, and a second terminal coupled to the output terminal of the second inverter 442. A second voltage V2 at the second node N2 is indirectly controlled by the fifth control signal S5 through the second inverter 442 and the second capacitor 262. A fourth switch of the pull-down circuit is implemented with the second transmission gate 424 which is closed or opened according to a sixth control signal S6 and an inverted sixth control signal $\overline{S6}$ (the sixth control signal S6 and the inverted sixth control signal $\overline{S6}$ are complementary).

Figure 6:
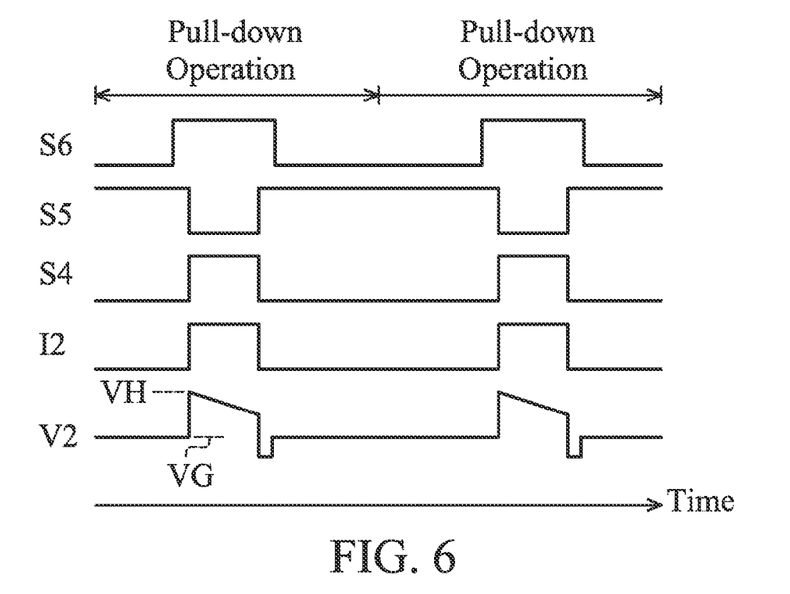
FIG. 6 is a diagram of signal waveforms of a pull-down circuit of a charge pump according to an embodiment of the invention.

FIG. 6 is a diagram of signal waveforms of the pull-down circuit of the charge pump 400 according to an embodiment of the invention. Please refer to FIG. 4 and FIG. 6 together. During each pull-down operation of the charge pump 400, in the beginning, the sixth control signal S6 switches from a low logic level to a high logic level. As a result, the second transmission gate 424 is opened, and second node N2 is isolated from the output node NOUT of the charge pump 400. Next, the fifth control signal S5 switches from a high logic level to a low logic level, such that a low-to-high level-shifting transition is applied to the second voltage V2 at the second node N2. As a result, the second voltage V2 at the second node N2 changes from an original voltage VG to a high level-shifting voltage VH, and the high level-shifting voltage VH is substantially equal to the original voltage VG plus the supply voltage VDD (i.e., VH=VG+VDD). Then, the fourth control signal S4 switches from a low logic level to a high logic level, such that the first NMOS transistor 423 is enabled and the second voltage V2 at the second node N2 is gradually discharged down by the second current I2 to the second current source 202. In some embodiments, the waveform of the fifth control signal S5 is substantially complementary to that of the fourth control signal S4. In some embodiments, the phase of the fifth control signal S5 is slightly leading or equal to that of the fourth control signal S4. After a period of discharging time, the fourth control signal S4 switches from the high logic level back to the low logic level so as to stop the discharging-down operation, and the fifth control signal S5 switches from the low logic level back to the high logic level, such that a high-to-low level-shifting transition is applied to the second voltage V2 at the second node N2. Finally, the sixth control signal S6 switches from the high logic level back to the low logic level, such that the second transmission gate 424 is closed and the second node N2 is coupled to the output node NOUT. The second voltage V2 at the second node N2 further slightly rises up due to the charge-sharing effect between the second node N2 and the output node NOUT. It is noted that during each pull-down operation of the charge pump 400, the sixth control signal S6 switches its logic level before the fourth control signal S4 and the fifth control signal S5 switch their logic levels, and then the sixth control signal S6 switches its logic level back after the fourth control signal S4 and the fifth control signal S5 switch their logic level back. With such a design, the output voltage VOUT at the output node NOUT is not affected by the variation of the second voltage V2 at the second node N2 during the pull-down operation, and therefore the second voltage V2 has a relatively wide operating range. Theoretically, if each transistor of the charge pump 400 has an overdrive voltage VOV, the second voltage V2 of the charge pump 400 can have a wide operating range which is substantially equal to two times the supply voltage VDD minus two times the overdrive voltage VOV (i.e., 2×VDD−2×VOV), and it can be much wider than that of the conventional design.

Figure 7A:
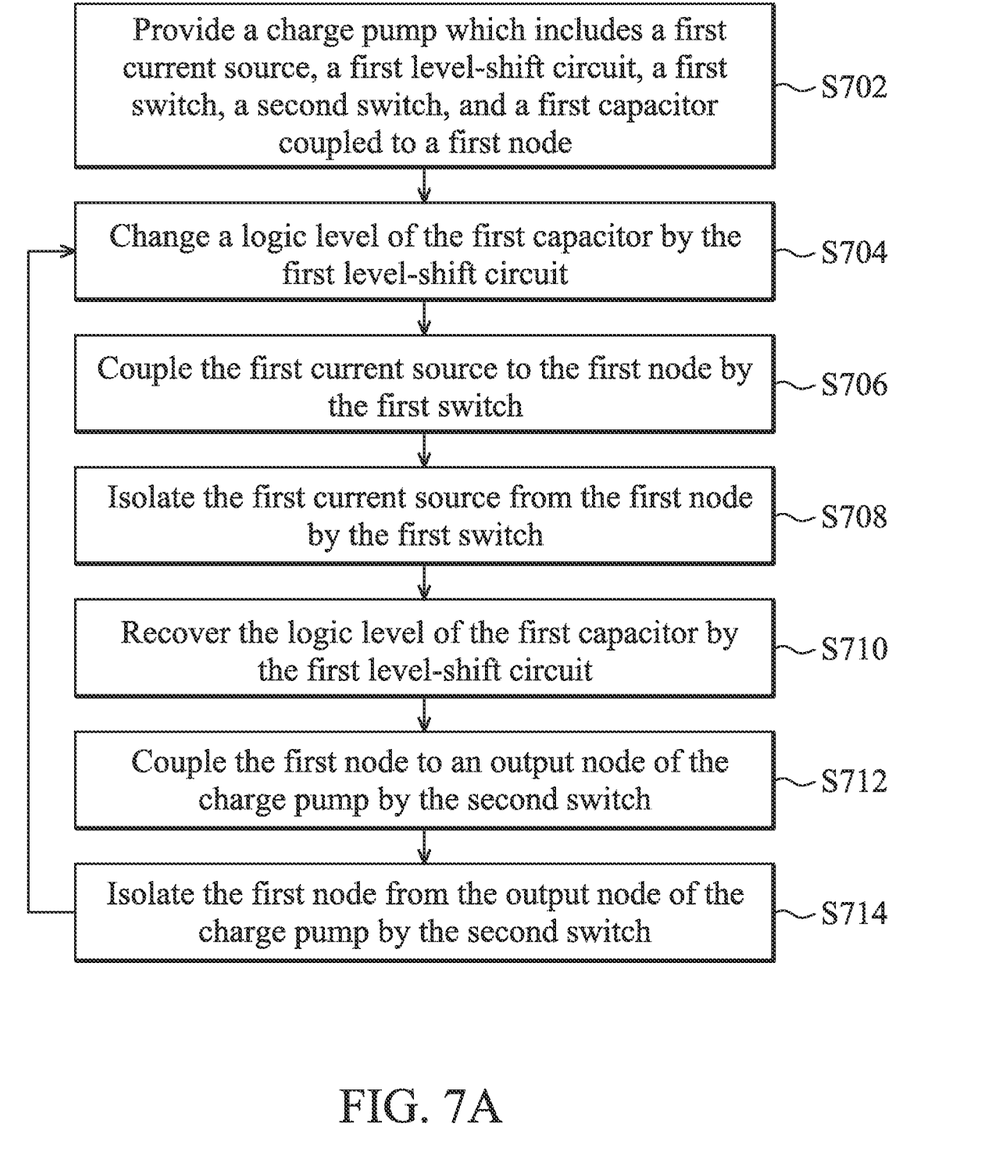
FIG. 7A is a flowchart of a method for operating a charge pump according to an embodiment of the invention.
Figure 8:
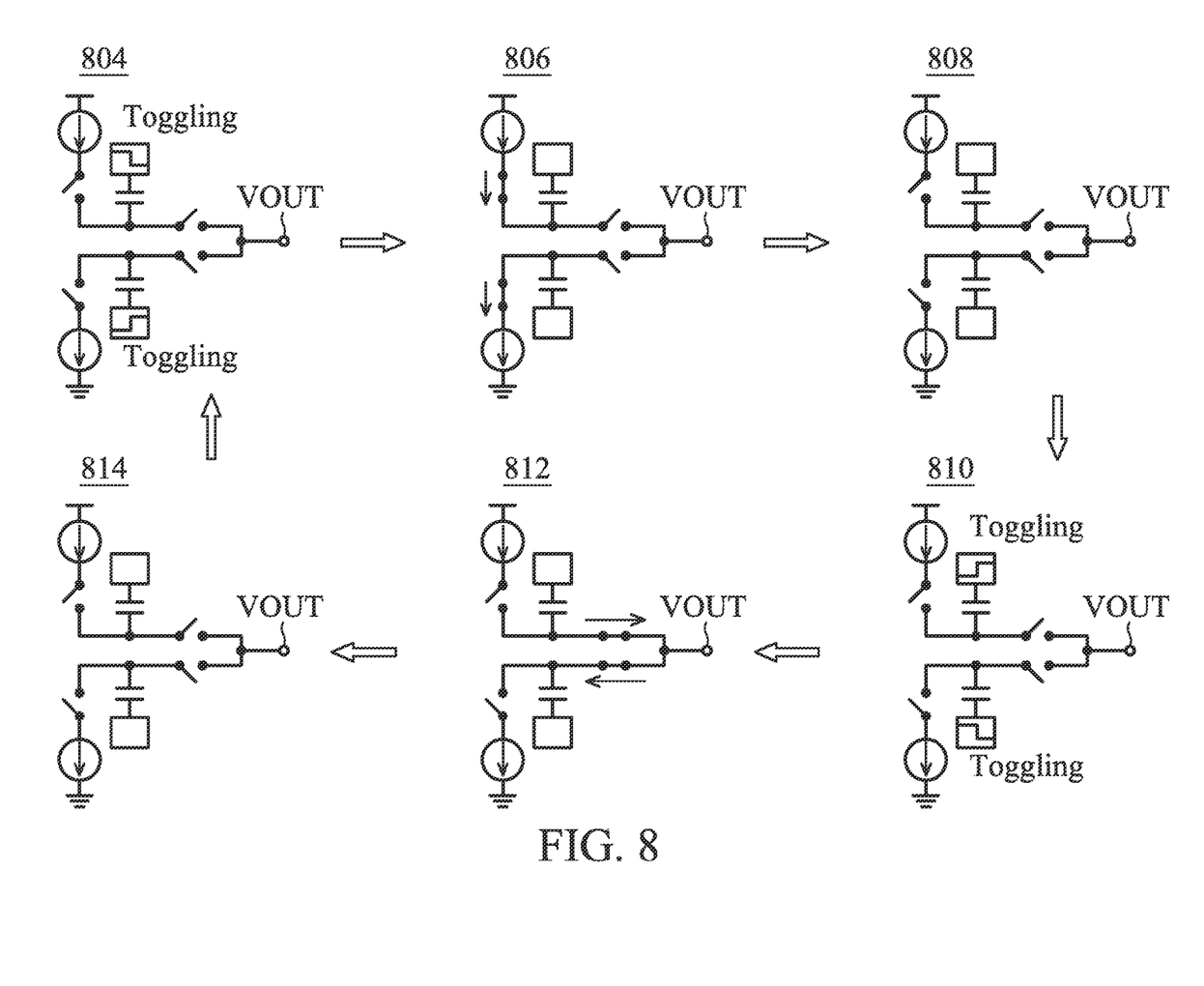
FIG. 8 is a diagram of states of a charge pump according to an embodiment of the invention.

FIG. 7A is a flowchart of a method for operating a charge pump according to an embodiment of the invention. FIG. 7A is related to the operation of a pull-up circuit of the charge pump. FIG. 8 is a diagram of the states of the charge pump according to an embodiment of the invention. Please refer to FIG. 7A and FIG. 8 together. In step S702, a charge pump is provided, and the charge pump includes a first current source, a first level-shift circuit, a first switch, a second switch, and a first capacitor coupled to a first node. In step S704, a logic level of the first capacitor is changed by the first level-shift circuit, and step S704 corresponds to a first state 804 of FIG. 8. For example, a high-to-low level-shifting transition may be applied to the logic level of the first capacitor. In step S706, the first current source is coupled to the first node by closing the first switch, and step S706 corresponds to a second state 806 of FIG. 8. For example, the first current source may supply a first current to the first node. In step S708, the first current source is isolated from the first node by opening the first switch, and step S708 corresponds to a third state 808 of FIG. 8. In step S710, the logic level of the first capacitor is recovered by the first level-shift circuit, and step S710 corresponds to a fourth state 810 of FIG. 8. For example, a low-to-high level-shifting transition may be applied to the logic level of the first capacitor. In step S712, the first node is coupled to an output node of the charge pump by closing the second switch, and step S712 corresponds to a fifth state 812 of FIG. 8. For example, the charges stored in the first capacitor may be shared by the first node and the output node. In step S714, the first node is isolated from the output node of the charge pump by opening the second switch, and step S714 corresponds to a sixth state 814 of FIG. 8. It is noted that step S704 may follow step S714 so as to form a cycle process. Steps S704-S710 of changing the logic level of the first capacitor, coupling the first current source to the first node, isolating the first current source from the first node, and recovering the logic level of the first capacitor should be performed while the first node is kept isolated from the output node of the charge pump. It is understood that any one or more features of the embodiment of FIGS. 2, 3A, 4, and 5 may be applied to the method of FIG. 7A.

Figure 7B:
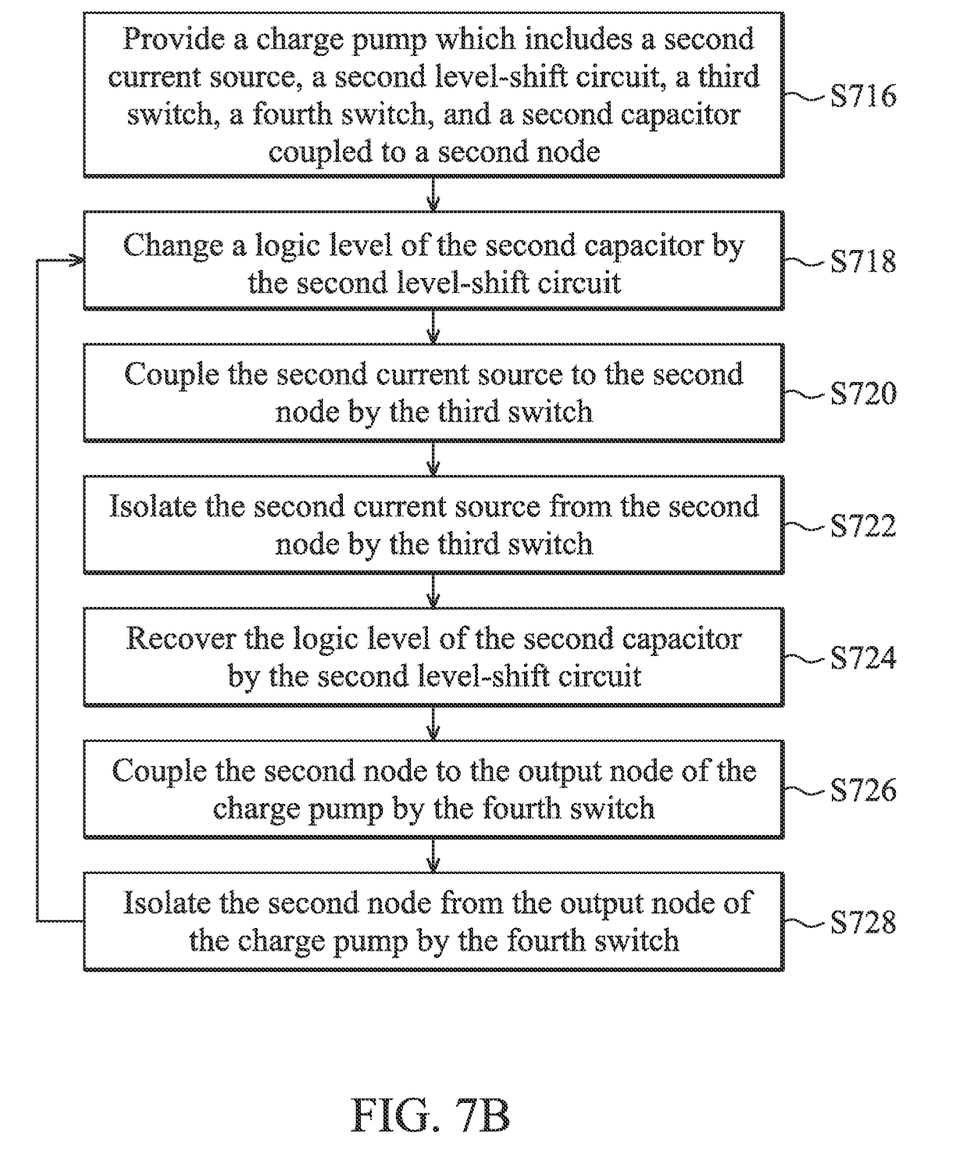
FIG. 7B is a flowchart of a method for operating a charge pump according to an embodiment of the invention.

FIG. 7B is a flowchart of a method for operating a charge pump according to an embodiment of the invention. FIG. 7B is related to the operation of a pull-down circuit of the charge pump. Please refer to FIG. 7B and FIG. 8 together. In step S716, a charge pump is provided, and the charge pump includes a second current source, a second level-shift circuit, a third switch, a fourth switch, and a second capacitor coupled to a second node. In step S718, a logic level of the second capacitor is changed by the second level-shift circuit, and step S718 corresponds to the first state 804 of FIG. 8. For example, a low-to-high level-shifting transition may be applied to the logic level of the second capacitor. In step S720, the second current source is coupled to the second node by closing the third switch, and step S720 corresponds to the second state 806 of FIG. 8. For example, the second current source may draw a second current from the second node. In step S722, the second current source is isolated from the second node by opening the third switch, and step S722 corresponds to the third state 808 of FIG. 8. In step S724, the logic level of the second capacitor is recovered by the second level-shift circuit, and step S724 corresponds to the fourth state 810 of FIG. 8. For example, a high-to-low level-shifting transition may be applied to the logic level of the second capacitor. In step S726, the second node is coupled to the output node of the charge pump by closing the fourth switch, and step S726 corresponds to the fifth state 812 of FIG. 8. For example, the charges stored in the second capacitor may be shared by the second node and the output node. In step S728, the second node is isolated from the output node of the charge pump by opening the fourth switch, and step S728 corresponds to the sixth state 814 of FIG. 8. It is noted that step S718 may follow step S728 so as to form a cycle process. Steps S718-S724 of changing the logic level of the second capacitor, coupling the second current source to the second node, isolating the second current source from the second node, and recovering the logic level of the second capacitor should be performed while the second node is kept isolated from the output node of the charge pump. It is understood that any one or more features of the embodiment of FIGS. 2, 3B, 4, and 6 may be applied to the method of FIG. 7B.

The invention provides a charge pump and a method for operating the charge pump. By appropriately designing and operating switches and level-shift circuits therein, the control voltage of the charge pump is temporarily isolated from the output voltage of the charge pump during the pull-up and pull-down operations. Since the output voltage is not directly affected by the control voltage, the freedom of operation of the control voltage is increased, and the operating range of the charge pump is widened accordingly. In a preferred embodiment, the operating range of charge pump is improved by an amount of the supply voltage VDD, and it is much better than that of the conventional design.

The above embodiments are just exemplary, rather than limitations of the invention. It is understood that the charge pump and the operating method thereof are not limited to the configurations and flowcharts of FIGS. 2-8. The invention may merely include any one or more features of any one or more embodiments of FIGS. 2-8. In other words, not all of the features shown in the figures should be implemented in the charge pump and the operating method of the invention.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A charge pump, comprising:
   a first current source;
   a first switch, coupled between the first current source and a first node;
   a first level-shift circuit;
   a first capacitor, coupled between the first node and the first level-shift circuit; and
   a second switch, coupled between the first node and an output node, wherein the first switch performs a closing-and-opening operation and the first level-shift circuit performs a level-shift operation while the second switch is kept open;
   a second current source;
   a third switch, coupled between the second current source and a second node;
   a second level-shift circuit;
   a second capacitor, coupled between the second node and the second level-shift circuit; and
   a fourth switch, coupled between the second node and the output node;
   wherein the third switch performs a closing-and-opening operation and the second level-shift circuit performs a level-shift operation while the fourth switch is kept open,
   wherein the first current source supplies a current to the first node, and the second current source draws a current from the second node.

2. The charge pump as claimed in claim 1, wherein the first level-shift circuit generates a level-shift signal which switches between a high logic level and a low logic level so as to change a first voltage at the first node.

3. The charge pump as claimed in claim 1, wherein the first current source supplies a current to the first node.

4. The charge pump as claimed in claim 1, wherein the first switch is implemented with an MOS transistor (Metal Oxide Semiconductor Field Effect Transistor) which has a control terminal for receiving a first control signal, a first terminal coupled to the first current source, and a second terminal coupled to the first node.

5. The charge pump as claimed in claim 4, wherein the first level-shift circuit comprises a first inverter which has an input terminal for receiving a second control signal, and output terminal coupled to the first capacitor.

6. The charge pump as claimed in claim 5, wherein the second control signal is substantially complementary to the first control signal.

7. The charge pump as claimed in claim 4, wherein the second switch is implemented with a transmission gate which is closed or opened according to a third control signal.

8. The charge pump as claimed in claim 7, wherein during each operation of the charge pump, the third control signal switches logic level before the first control signal switches logic level, and then the third control signal switches back after the first control signal switches back.

9. The charge pump as claimed in claim 1, wherein the second level-shift circuit generates a level-shift signal which switches between a high logic level and a low logic level so as to change a second voltage at the second node.

10. The charge pump as claimed in claim 1, wherein the third switch is implemented with an MOS transistor (Metal Oxide Semiconductor Field Effect terminal coupled to the second current source, and a second terminal coupled to the second node.

11. The charge pump as claimed in claim 10, wherein the second level-shift circuit comprises a second inverter which has an input terminal for receiving a fifth control signal, and output terminal coupled to the second capacitor.

12. The charge pump as claimed in claim 11, wherein the fifth control signal is substantially complementary to the fourth control signal.

13. The charge pump as claimed in claim 12, wherein the fourth switch is implemented with a transmission gate which is closed or opened according to a sixth control signal.

14. The charge pump as claimed in claim 13, wherein during each operation of the charge pump, the sixth control signal switches logic level before the fourth control signal switches logic level, and then the sixth control signal switches back after the fourth control signal switches back.

15. A method for operation of a charge pump, comprising the steps of:
   providing the charge pump which comprises a first current source, a first level-shift circuit, a first switch, a second switch, a first capacitor coupled to a first node, a second current source, a second level-shift circuit, a third switch, a fourth switch, and a second capacitor coupled to a second node;
   supplying a current to the first node by the first current source;
   changing a logic level of the first capacitor by the first level-shift circuit;
   coupling the first current source to the first node by the first switch;
   isolating the first current source from the first node by the first switch;
   recovering the logic level of the first capacitor by the first level-shift circuit;
   coupling the first node to an output node of the charge pump by the second switch;
   isolating the first node from the output node of the charge pump by the second switch;
   drawing a current from the second node by the second current source;
   changing a logic level of the second capacitor by the second level-shift circuit;
   coupling the second current source to the second node by the third switch;
   isolating the second current source from the second node by the third switch;
   recovering the logic level of the second capacitor by the second level-shift circuit;
   coupling the second node to the output node of the charge pump by the fourth switch; and
   isolating the second node from the output node of the charge pump by the fourth switch.

16. The method as claimed in claim 15, wherein the steps of changing the logic level of the first capacitor, coupling the first current source to the first node, isolating the first current source from the first node, and recovering the logic level of the first capacitor are performed while the first node is kept isolated from the output node of the charge pump.

17. The method as claimed in claim 15, wherein the steps of changing the logic level of the second capacitor, coupling the second current source to the second node, isolating the second current source from the second node, and recovering the logic level of the second capacitor are performed while the second node is kept isolated from the output node of the charge pump.

* * * * *